United States Patent
Neogi et al.

(10) Patent No.: US 10,181,522 B2
(45) Date of Patent: Jan. 15, 2019

(54) SIMPLIFIED GATE TO SOURCE/DRAIN REGION CONNECTIONS

(71) Applicant: GLOBALFOUNDRIES Inc., Grand Cayman (KY)

(72) Inventors: Tuhin Guha Neogi, Clifton Park, NY (US); Scott D. Luning, Albany, NY (US); David Pritchard, Glenville, NY (US); Kasun Anupama Punchihewa, Naperville, IL (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/437,846

(22) Filed: Feb. 21, 2017

(65) Prior Publication Data
US 2018/0240885 A1    Aug. 23, 2018

(51) Int. Cl.
*H01L 29/66* (2006.01)
*H01L 29/423* (2006.01)
*H01L 29/78* (2006.01)
*H01L 21/8238* (2006.01)

(52) U.S. Cl.
CPC .... *H01L 29/665* (2013.01); *H01L 21/823835* (2013.01); *H01L 21/823864* (2013.01); *H01L 21/823885* (2013.01); *H01L 29/42356* (2013.01); *H01L 29/66553* (2013.01); *H01L 29/66666* (2013.01); *H01L 29/7827* (2013.01)

(58) Field of Classification Search
CPC ..... H01L 21/823835; H01L 21/823864; H01L 21/823885; H01L 29/665; H01L 29/42356; H01L 29/66553; H01L 29/66666; H01L 29/7827
See application file for complete search history.

(56) References Cited

U.S. PATENT DOCUMENTS

| | | | |
|---|---|---|---|
| 8,618,607 B1 | 12/2013 | Rashed et al. | |
| 8,836,040 B2 | 9/2014 | Kamal et al. | |
| 2007/0023832 A1* | 2/2007 | Matsui | H01L 21/76895 257/344 |
| 2011/0227136 A1* | 9/2011 | Park | H01L 21/28518 257/288 |
| 2012/0211836 A1* | 8/2012 | Takeuchi | H01L 21/76834 257/368 |
| 2014/0048889 A1 | 2/2014 | Bitterlich | |
| 2014/0183647 A1 | 7/2014 | Lu et al. | |
| 2015/0001583 A1* | 1/2015 | Zhang | H01L 29/165 257/192 |
| 2015/0287636 A1* | 10/2015 | Wei | H01L 21/823878 257/368 |

\* cited by examiner

*Primary Examiner* — Joseph Galvin, III
(74) *Attorney, Agent, or Firm* — Thompson Hine LLP; Anthony Canale (57) ABSTRACT

Structures for a field-effect transistor and fabrication methods for forming a structure for a field-effect transistor. The structure may include a gate electrode, a source/drain region formed adjacent to a vertical sidewall of the gate electrode, and a conductive link that couples the vertical sidewall of the gate electrode with the source/drain region.

11 Claims, 5 Drawing Sheets

SIMPLIFIED GATE TO SOURCE/DRAIN REGION CONNECTIONS

BACKGROUND

The invention relates generally to semiconductor devices and integrated circuit fabrication and, in particular, to structures for a field-effect transistor and fabrication methods for forming a structure for a field-effect transistor.

Modern electronics achieve high levels of functionality in small and compact form factors by integrating multiple functions onto a single chip. A common fabrication process that allows high levels of integration at a relatively low cost is complementary metal-oxide-semiconductor (CMOS). CMOS processes build a combination of p-channel and n-channel metal-oxide-semiconductor field-effect transistors (MOSFETs) to implement logic gates and other types of digital circuits, as well as analog circuits. A field-effect transistor includes a gate electrode and source/drain regions between which a current can flow. A control voltage applied to the gate electrode controls the flow of current through a channel within the substrate between the source/drain regions.

Middle-of-line (MOL) processing includes the formation of gate contacts and source/drain contacts. A tie-off structure may be formed during middle-of-line MOL processing may be used to couple or "tie-off" a drain or source of a field-effect transistor to a dummy gate. The tie-off structure includes metallization formed in a MOL dielectric layer that couples the gate contact with one of the source/drain contacts of the field-effect transistor. Another way to couple the dummy gate to ground or power is to terminate one side of the active area at which the dummy gate is located, which prevents the dummy gate from forming a drain contact. This is known as a "diffusion break approach". The diffusion break approach may use two dummy gates, one dummy gate on each side of the broken active area.

Improved structures for a field-effect transistor and fabrication methods for forming a structure for a field-effect transistor are needed.

SUMMARY

In an embodiment of the invention, a method for forming a field-effect transistor includes forming a gate electrode, forming a source/drain region adjacent to a vertical sidewall of the gate electrode, and forming a conductive link coupling the vertical sidewall of the gate electrode with the source/drain region.

In an embodiment of the invention, a structure for a field-effect transistor includes a gate electrode, a source/drain region adjacent to a vertical sidewall of the gate electrode, and a conductive link coupling the vertical sidewall of the gate electrode with the source/drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
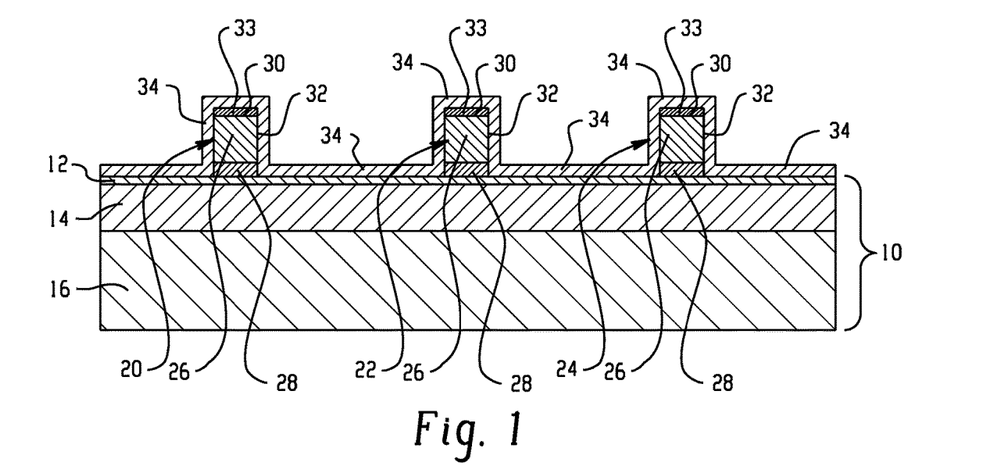
FIGS. 1-4 are cross-sectional views of a portion of a substrate at successive fabrication stages of a processing method for fabricating a structure in accordance with embodiments of the invention.

With reference to FIG. 1 and in accordance with an embodiment of the invention, a substrate 10 in the representative form of a semiconductor-on-insulator (SOI) substrate includes a device layer 12, a buried dielectric layer in the form of a buried oxide (BOX) layer 14 comprised of an oxide of silicon (e.g., $SiO_2$), and a handle wafer 16. The device layer 12 is separated from the handle wafer 16 by the intervening BOX layer 14 and is considerably thinner than the handle wafer 16. The device layer 12 and the handle wafer 16 may be comprised of a single crystal semiconductor material, such as silicon. The BOX layer 14 has a surface in direct contact with the handle wafer 16 along an interface and another surface in direct contact with the device layer 12 along another interface, and these surfaces are separated by the thickness of the BOX layer 14 that terminates at the rim of the substrate 10. The device layer 12 is electrically isolated from the handle wafer 16 by the BOX layer 14. The handle wafer 16 may be lightly doped to have, for example, p-type conductivity. The front side of the substrate 10 including the device layer 12 may be considered to be an active device side of the substrate 10.

Gate structures 20, 22, 24 may be formed on the device layer 12. Each of the gate structures 20, 22, 24 includes a gate electrode 26 and a gate dielectric 28 arranged in a layer stack. The gate electrodes 26 may be comprised of a metal, a silicide, polycrystalline silicon (polysilicon), or combinations of these materials, deposited by physical vapor deposition (PVD), CVD, etc. The gate dielectrics 28 may be comprised of a dielectric or insulating material, such as silicon dioxide, a high-k dielectric material such as hafnium oxide, or layered combinations of these and other dielectric materials, deposited by CVD, atomic layer deposition (ALD), etc. The gate structures 20, 22, 24 may be formed by patterning the layer stack of their constituent materials with photolithography and etching.

Each of the gate structures 20, 22, 24 includes a top surface 30 and vertical sidewalls 32 that extend from the top surface 30 to the top surface of the device layer 12. A cap 33 comprised of a dielectric material, such as silicon nitride ($Si_3N_4$), is located on the top surface 30 of each of the gate structures 20, 22, 24. A conformal layer 34 is deposited on the device layer 12 and covers the top surface 30 and vertical sidewalls 32 of each of the gate structures 20, 22, 24. The conformal layer 34 may be comprised of a dielectric material, such as silicon nitride ($Si_3N_4$) deposited by CVD. The gate structures 20, 22, 24 may be dummy gate structures.

Figure 2:
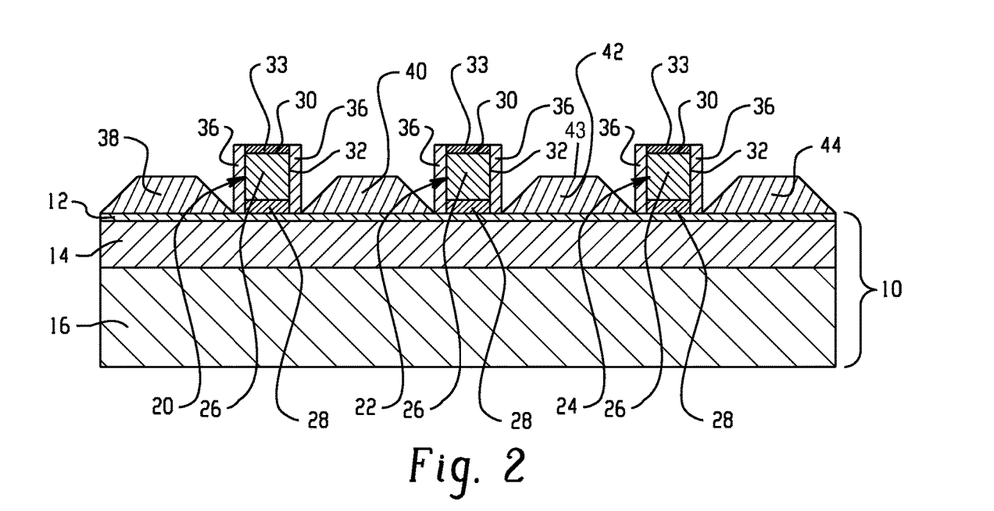

With reference to FIG. 2 in which like reference numerals refer to like features in FIG. 1 and at a subsequent fabrication stage, non-conductive spacers 36 are formed on the top surface of the device layer adjacent to the vertical sidewalls 32 of the gate structures 20, 22, 24. The non-conductive spacers 36 may be formed by shaping the conformal layer 34 with an anisotropic etching process, such as reactive ion etching (RIE), that preferentially removes the dielectric material from horizontal surfaces (e.g., the top surface of the device layer 12 and the top surfaces 30 of the gate structures 20, 22, 24).

Raised source/drain regions 38, 40, 42, 44 are formed adjacent to the vertical sidewalls 32 of the gate structures 20, 22, 24. As used herein, the term "source/drain region" refers to a doped region of semiconductor material that can function as either a source or a drain of a field-effect transistor. The source/drain regions 38, 40, 42, 44 may be formed by an epitaxial growth process that deposits sections of a semiconductor material, such as silicon germanium (SiGe), at the designated areas on the top surface of device layer 12 that were opened in the conformal layer 34. In an embodiment, the raised source/drain regions 38, 40, 42, 44 may be formed by a selective epitaxial growth process in which semiconductor material nucleates for epitaxial growth on semiconductor surfaces (e.g., the top surface of the device layer 12), but does not nucleate for epitaxial growth from insulator surfaces (e.g., the caps 33 and spacers 36). The gate structures 20, 22, 24 may function to self-align the semiconductor material of the source/drain regions 38, 40, 42, 44 during epitaxial growth. The constituent semiconductor material may be in situ doped during growth to impart a given conductivity type to the sections of semiconductor material. The semiconductor material of the raised source/drain regions 38, 40, 42, 44 may comprise an n-type dopant from Group V of the Periodic Table (e.g., phosphorus (P) or arsenic (As)) that is effective to impart n-channel conductivity.

Figure 3:
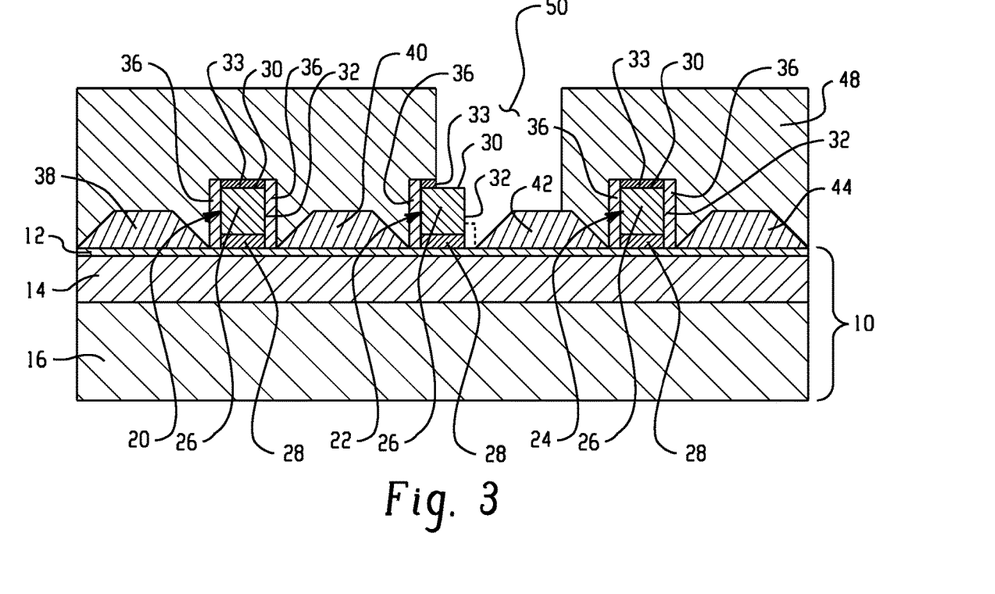

With reference to FIG. 3 in which like reference numerals refer to like features in FIG. 2 and at a subsequent fabrication stage, an etch mask 48 is applied and patterned. The etch mask 48 may be comprised of a layer of a light-sensitive material, such as an organic photoresist, that may be applied as a fluid by a spin coating process, pre-baked, exposed to light projected through a photomask, baked after exposure, and developed with a chemical developer to define one or more openings exposing selective areas for removal of one or more of the spacers 36 with an etching process. In the representative embodiment, an opening 50 in the etch mask 48 exposes one of the spacers 36 adjacent to one of the vertical sidewalls 32 of the gate structure 22 and at least a portion of the source/drain region 42, as well as all or a portion of the cap 33 on the top surface 30 of gate structure 22.

The spacer 36 associated with the gate structure 22, and that is exposed by the opening 50 in the etch mask 48, is etched using an etching process with an etch chemistry that removes the material of the spacer 36 selective to the materials of the source/drain region 42 and the gate electrode 26. Due to masking provided by the etch mask 48 during the performance of the etching process, the spacers 36 on the gate structures 20 and 24, as well as one of the spacers 36 on gate structure 22, are intact following the etching process. The exposed portion of the cap 33 on the gate electrode 26 of gate structure 22 is also etched by the etching process, and the etch chemistry removes the material of the cap 33 selective to the materials of the source/drain region 42 and the gate electrode 26.

The vertical sidewall 32 of the gate electrode 26 of gate structure 22 is exposed after the removal of the spacer 36. In the representative embodiment, the spacer 36 is completely removed so that the vertical sidewall 32 of the gate electrode 26 is fully exposed. The removal of the spacer 36 leaves an unfilled gap as an open space between one of the vertical sidewalls 32 of the gate electrode 26 of the gate structure 22 and the raised source/drain region 42. In an alternative embodiment and as diagrammatically shown in FIG. 3 by the dashed lines, the spacer 36 may be recessed relative to the top surface 30 of the gate structure 22 and only partially removed so that the vertical sidewall 32 of the gate electrode 26 of gate structure 22 is only partially exposed.

Figure 4:
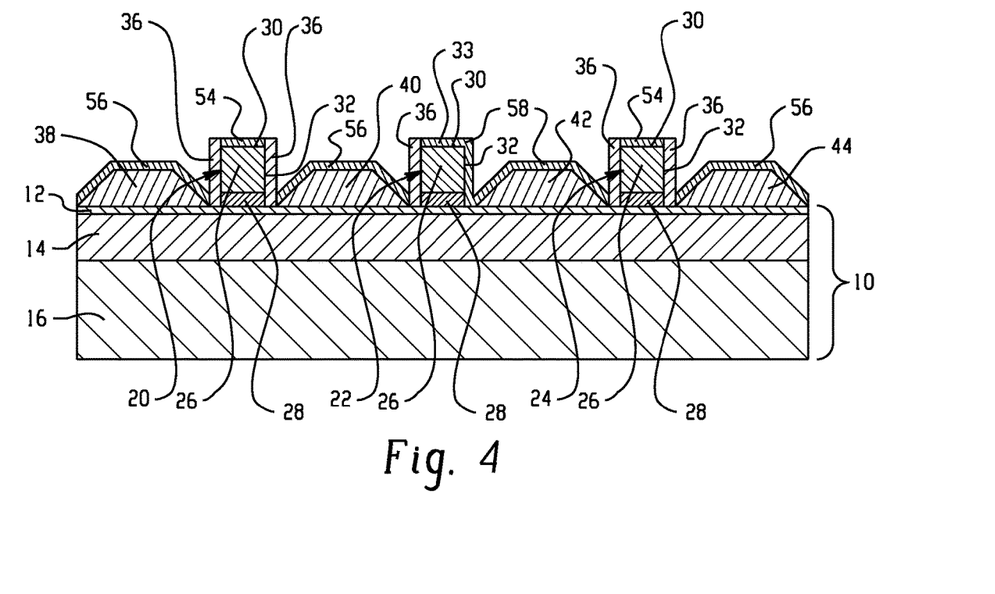

With reference to FIG. 4 in which like reference numerals refer to like features in FIG. 3 and at a subsequent fabrication stage, the caps 33 are fully removed from the top surfaces 30 of the gate structures 20, 22, 24. A silicide layer 52 is formed on the gate electrodes 26 and raised source/drain regions 38, 40, 42, 44 associated with gate structures 20, 22, 24. The silicide layer 52 may be formed by a salicidation process (i.e., self-aligned silicidation) that involves one or more annealing steps reacting a deposited layer of a silicide-forming metal, such as titanium (Ti), cobalt (Co), or nickel (Ni), with the semiconductor materials of the raised source/drain regions 38, 40, 42, 44 and the gate electrodes 26 to form a silicide phase at their respective top surfaces. The silicide layer 52 does not form on the spacers 36, which are comprised of a dielectric material that does not support silicidation.

Sections 54 of the silicide layer 52 form on the top surfaces 30 of the gate electrodes 26 of gate structures 20 and 24. Sections 56 of the silicide layer 52 form on the top surfaces of the raised source/drain regions 38, 40, and 44. A section 58 of the silicide layer 52 is located on the top surface 30 of the gate electrode 26 of gate structure 22, the vertical sidewall 32 of the gate electrode 26 of gate structure 22, and the top surface 43 of the raised source/drain region 42. The recess or removal of the spacer 36 permits the section 58 of the silicide layer to form on the vertical sidewall 32 of the gate electrode 26 of gate structure 22. Section 58 includes one of the sections 54 on the top surface 30 of the gate electrode 26 of gate structure 22, one of the sections 56 on the top surface of the raised source/drain region 42, and an additional connecting section that provides a bridge between these sections 54 and 56. The section 58 of the silicide layer 52 forms a continuous conductive link between the gate electrode 26 of gate structure 22 and the raised source/drain region 42. This continuous conductive link shorts the gate electrode 26 and the raised source/drain region 42 such that these objects are at the same electrical potential during chip operation.

In the alternative embodiment in which the spacer 36 is recessed instead of removed, the section 58 of the silicide layer may bridge across the recessed top surface of the spacer 36 between the raised source/drain region 42 and the vertical sidewall 32 of the gate structure 22. The dielectric material of the spacer 36 does not support the formation of silicide, but the silicide layer 52 forming on the raised source/drain region 42 and the vertical sidewall 32 of the gate structure 22 may connect in the space above the recessed top surface of the spacer 35.

Middle-of-line (MOL) processing and back-end-of-line (BEOL) processing follows, which includes formation of contacts and wiring for the local interconnect structure overlying the field-effect transistors, and formation of dielectric layers, via plugs, and wiring for an interconnect structure coupled by the interconnect wiring with the field-effect transistors. One or all of the gate structures 20, 22, 24 may be dummy structures that are not contacted by MOL processing. After processing is completed, the SOI substrate 10 may be diced into multiple chips each including one or more integrated circuits.

The connection of the gate electrode 26 of gate structure 22 and the raised source/drain region 42 provides a tie-off structure that may be used for isolation purposes. The embodiments of the invention allow enable the formation of a gate-tie off construct without the usage of contact layers formed during MOL processing, which reduces MOL congestion. Silicide, which is a conductive alloy, promotes the connectivity between the gate electrode of the intended dummy gate structure and the source/drain region. The gate-tie off construct may be used in consecutive gate pitches without missing a critical poly pitch (CPP), which conserves cell area and prevents any compromise in the design rules for the contacts to other gate electrodes that are contacted by MOL contacts.

Figure 5:
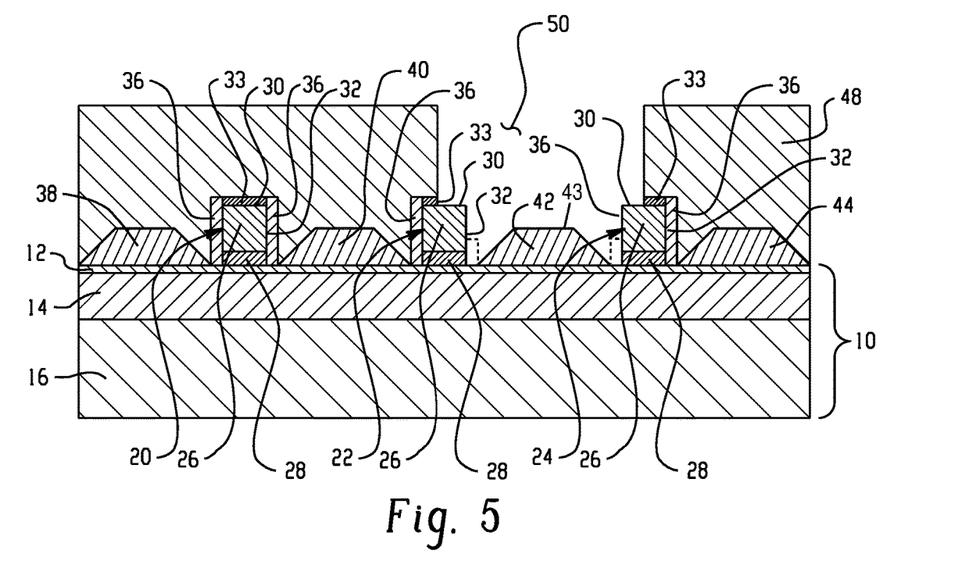
FIGS. 5 and 6 are cross-sectional views of a portion of a substrate at successive fabrication stages of a processing method for fabricating a structure in accordance with embodiments of the invention.

With reference to FIG. 5 in which like reference numerals refer to like features in FIG. 3 and in accordance with alternative embodiments of the invention, the opening 50 in the etch mask 48 may be widened to further expose one of the spacers 36 adjacent to one of the vertical sidewalls 32 of the gate structure 24, as well as all or a portion the cap 33 on the top surface 30 of gate structure 24. During the etching process removing the spacer 36 of gate structure 24, the spacer 36 associated with the gate structure 24 and also exposed by the widened opening 50 in the etch mask 48 is etched by the etching process with the etch chemistry that removes the material of the spacer 36 selective to the materials of the gate electrodes 26 and the raised source/drain region 42.

The vertical sidewall 32 of the gate electrode 26 of gate structure 22 and the vertical sidewall 32 of the gate electrode 26 of gate structure 24 are exposed after the removal of the spacers 36. In the representative embodiment, the spacers 36 are completely removed so that the vertical sidewalls 32 of the gate electrodes 26 are fully exposed. The removal of the spacers 36 leaves unfilled gaps as open spaces between one of the vertical sidewalls 32 of the gate electrode 26 of the gate structure 22 and the raised source/drain region 42, as well as between one of the vertical sidewalls 32 of the gate electrode 26 of the gate structure 24 and the raised source/drain region 42. In an alternative embodiment and as diagrammatically shown in FIG. 3 by the dashed lines, the spacers 36 may be recessed relative to the top surface 30 of the gate structure 22 and only partially removed so that the vertical sidewalls 32 of the gate electrodes 26 are only partially exposed.

Figure 6:
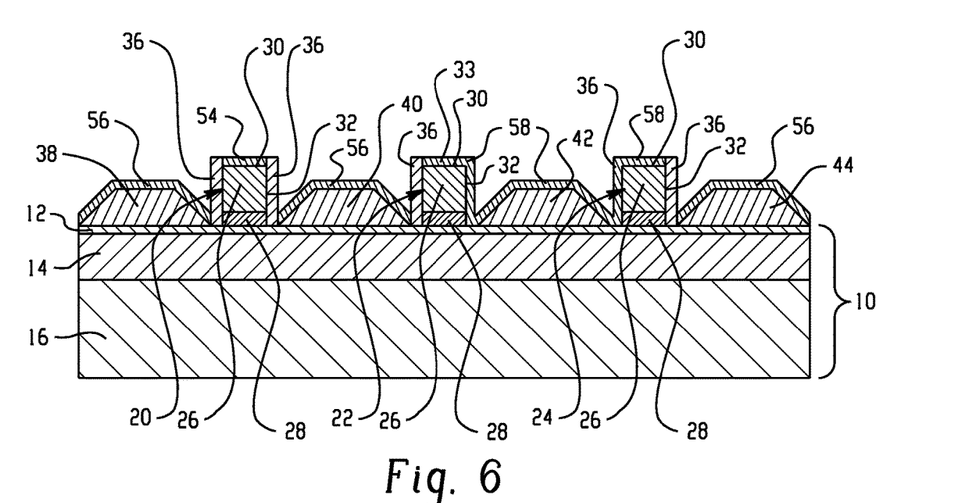

With reference to FIG. 6 in which like reference numerals refer to like features in FIG. 5 and at a subsequent fabrication stage, processing continues to form the silicide layer 52. The section 58 of the silicide layer 52 is formed on the exposed vertical sidewall 32 of the gate electrode 26 of gate structure 24, as well as on to the vertical sidewall 32 of the gate electrode 26 of gate structure 22 and the top surface of the raised source/drain region 44. The section 58 of the silicide layer 52 forms a continuous conductive link between the gate electrode 26 of gate structure 22, the raised source/drain region 44, and the gate electrode 26 of gate structure 24. Section 58 includes one of the sections 54 on the top surface 30 of the gate electrode 26 of gate structure 22, one of the sections 56 on the top surface of the raised source/drain region 42, one of the sections 54 on the top surface 30 of the gate electrode 26 of gate structure 24, and additional connecting sections that provide electrically-conductive bridges between these sections 54 and 56 of the silicide layer 52.

The continuous conductive link provided by the silicide layer section 58 shorts the gate electrodes 26 of the different gate structures 22, 24 and the raised source/drain region 42. However, the gate electrode 26 of additional gate structures, e.g., the gate electrode 26 of gate structure 20, may be linked along with the gate electrodes 26 of the gate structures 22, 24 and the raised source/drain region 44. To that end, the width of the opening 50 in the etch mask 48 may be further widened so that additional spacers 36 are removed. For example, the other spacer 36 on of gate structure 22 may be removed along with one of the spacers 36 of gate structure 20 such the conductive link provided by the silicide layer 52 links more than two gate electrodes 26 and multiple raised source/drain regions 40, 42.

Figure 7:
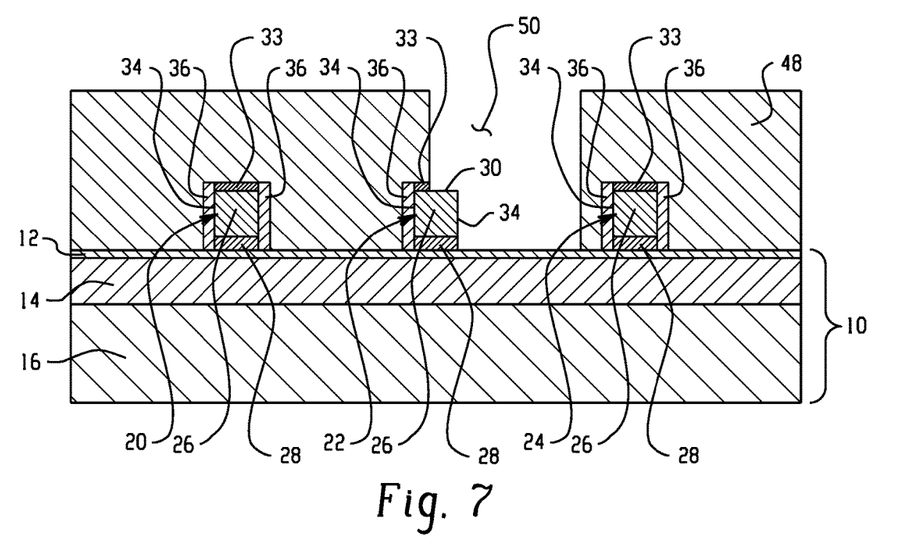
FIGS. 7-9 are cross-sectional views of a portion of a substrate at successive fabrication stages of a processing method for fabricating a structure in accordance with embodiments of the invention.

With reference to FIG. 7 in which like reference numerals refer to like features in FIG. 1 and in accordance with alternative embodiments of the invention, the spacer 36 associated with the gate structure 22 may be recessed or removed by an etching process before the epitaxial semiconductor material is grown to form the raised source/drain regions 38, 40, 42, 44. The etch mask 48 is applied and patterned to form the opening 50 that exposes one of the spacers 36 adjacent to one of the vertical sidewalls 32 of the gate structure 22, as well as the cap 33 on the top surface 30 of gate structure 22. The spacer 36 associated with the gate structure 22 and exposed by the opening 50 in the etch mask 48 is etched using an etching process with an etch chemistry that removes the material of the spacer 36 selective to the materials of the device layer 12 and the gate electrode 26.

Figure 8:
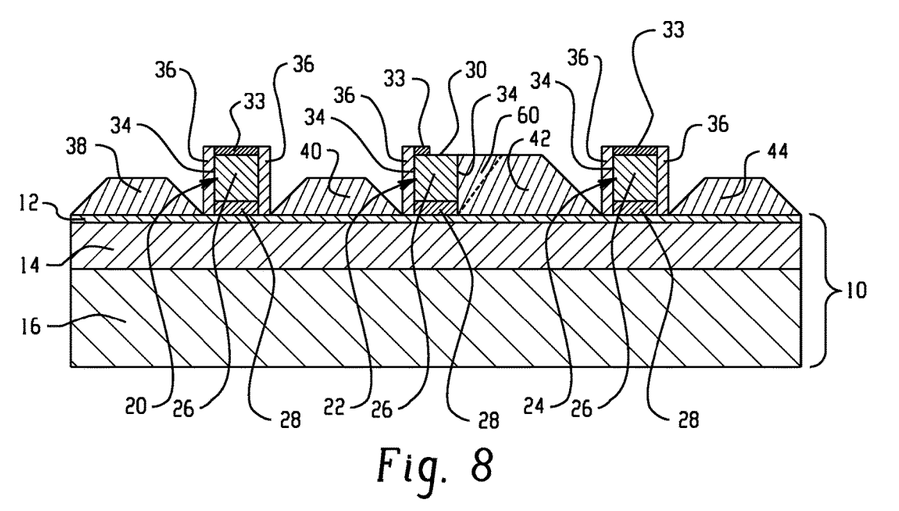

With reference to FIG. 8 in which like reference numerals refer to like features in FIG. 7 and at a subsequent fabrication stage, the etch mask 48 is stripped, and processing continues to form the raised source/drain regions 38, 40, 42, 44. The epitaxial semiconductor material of the raised source/drain region 42 grows vertically from the area of the device layer 12 opened in the conformal layer 34. A section 60 comprised of the epitaxial semiconductor material of the raised source/drain region 42 also grows horizontally from the exposed sidewall of the gate electrode 26 of the gate structure 22. The growth fronts merge to unite the section 60 with the raised source/drain region 42 along the inclined dashed line, which provides a conductive link furnishing the electrical connection between the gate electrode 26 of gate structure 22 and the raised source/drain region 44 that is adjacent to the gate structure 22. This conductive link provided by section 60 shorts the gate electrode 26 of the gate structure 22 and the raised source/drain region 42.

Figure 9:
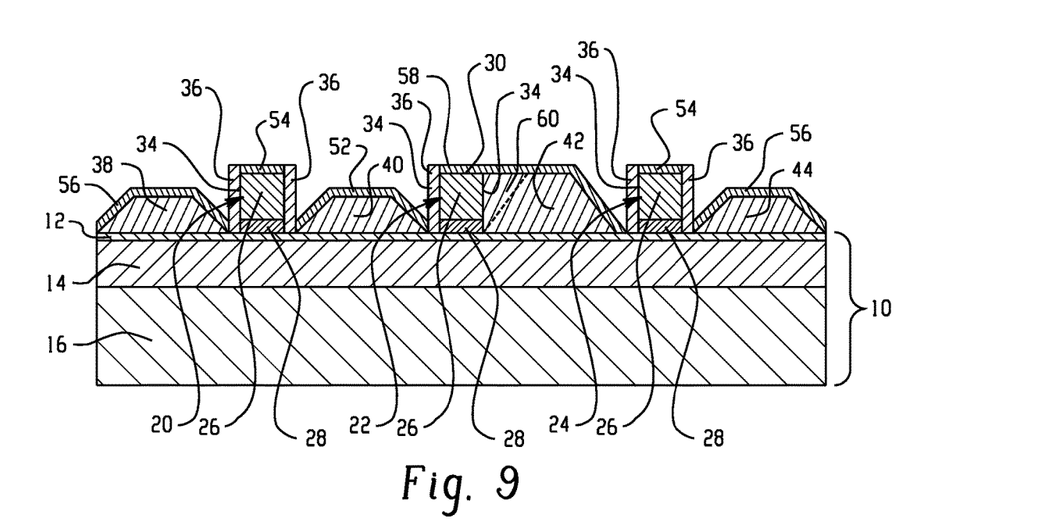

With reference to FIG. 9 in which like reference numerals refer to like features in FIG. 8 and at a subsequent fabrication stage, processing continues to form the silicide layer 52. The section 58 of the silicide layer 52 is formed on the top surface 30 of the gate electrode 26 of gate structure 22, and the top surface of the raised source/drain region 42.

Figure 10:
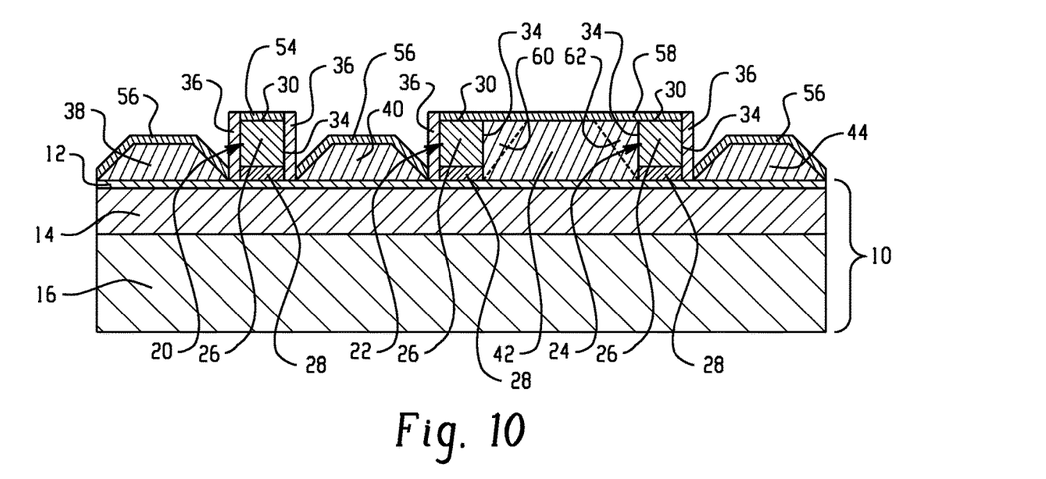
FIG. 10 is a cross-sectional view similar to FIG. 9 of a structure fabricated by a processing method in accordance with embodiments of the invention.

With reference to FIG. 10 in which like reference numerals refer to like features in FIG. 9 and in accordance with alternative embodiments of the invention, the spacer 36 associated with the gate structure 24 may also be etched using the widened opening 50 in etch mask 48 and the related etching process. A section 62 comprised of the epitaxial semiconductor material of the raised source/drain region 42 also grows horizontally from the exposed sidewall of the gate electrode 26 of the gate structure 24. The growth fronts merge along the inclined dashed line to unite the section 62 with the raised source/drain region 42, which provides a conductive link furnishing the electrical connection between the gate electrode 26 of gate structure 24 and the raised source/drain region 44 that is adjacent to the gate structure 24. This conductive link provided by section 62 shorts the gate electrode 26 of the gate structure 24 and the raised source/drain region 42. The conductive link provided by section 60, as discussed above in the context of FIG. 8, shorts the gate electrode 26 of the gate structure 22 and the raised source/drain region 42. Consequently, the gate electrode 26 of the gate structure 22, the gate electrode 26 of the gate structure 24, and the raised source/drain region 42 are shorted together by the sections 60, 62 comprised of the epitaxial semiconductor material of the raised source/drain region 42.

The continuous conductive link provided by the sections 60, 62 comprised of the epitaxial semiconductor material of the raised source/drain region 42 shorts the gate electrodes 26 of the different gate structures 22, 24 and the raised source/drain region 42. However, the gate electrode 26 of additional gate structures, e.g., the gate electrode 26 of gate structure 20, may be linked along with the gate electrodes 26 of the gate structures 22, 24 and the raised source/drain region 44. To that end, the width of the opening 50 in the etch mask 48 may be further widened so that additional spacers 36 are removed. For example, the other spacer 36 on of gate structure 22 may be removed along with one of the spacers 36 of gate structure 20 such the conductive link provided by sections of the epitaxial semiconductor material of the raised source/drain regions 40, 42 links more than two gate electrodes 26 and multiple raised source/drain regions 40, 42.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a first semiconductor layer including a top surface;
   a first gate electrode including a top surface and a vertical sidewall extending from the top surface of the first semiconductor layer to the top surface of the first gate electrode;
   a first raised source/drain region on the top surface of the first semiconductor layer adjacent to the vertical sidewall of the first gate electrode; and
   a conductive link coupling the first gate electrode with the first raised source/drain region, the conductive link in direct contact with the vertical sidewall of the first gate electrode over a full height of the vertical sidewall of the first gate electrode.

2. The structure of claim 1 wherein the conductive link is a silicide layer.

3. The structure of claim 2 further comprising:
   a second gate electrode having a vertical sidewall horizontally spaced from the vertical sidewall of the first gate electrode,
   wherein the first raised source/drain region is located between the vertical sidewall of the first gate electrode and the vertical sidewall of the second gate electrode, and the silicide layer couples the second gate electrode with the first gate electrode and the first raised source/drain region.

4. The structure of claim 1 further comprising:
   a second gate electrode having a vertical sidewall horizontally spaced from the vertical sidewall of the first gate electrode, the first raised source/drain region located between the vertical sidewall of the first gate electrode and the vertical sidewall of the second gate electrode,
   wherein the conductive link couples the second gate electrode with the first gate electrode and the first raised source/drain region.

5. The structure of claim 1 wherein the first raised source/drain region includes a first section of a second semiconductor layer, and the conductive link includes a second section of the second semiconductor layer that extends from the vertical sidewall of the first gate electrode to provide the conductive link by merging the second section of the second semiconductor layer with the first section of the second semiconductor layer.

6. The structure of claim 5 further comprising:
   a second raised source/drain region; and
   a sidewall spacer between the second raised source/drain region and the vertical sidewall of the first gate electrode,
   wherein the first gate electrode is located between the first raised source/drain region and the second raised source/drain region.

7. The structure of claim 5 further comprising:
   a second gate electrode having a vertical sidewall horizontally spaced from the vertical sidewall of the first gate electrode,
   wherein the first raised source/drain region is located between the vertical sidewall of the first gate electrode and the vertical sidewall of the second gate electrode, and the conductive link includes a third section of the second semiconductor layer that extends from the vertical sidewall of the second gate electrode to couple the second gate electrode with the first gate electrode and the first raised source/drain region.

8. A method for forming a field-effect transistor, the method comprising:
   forming a first gate electrode including a vertical sidewall extending from a top surface of a first semiconductor layer;
   forming a sidewall spacer directly adjacent to the vertical sidewall of the first gate electrode;
   epitaxially growing a raised source/drain region on the top surface of the first semiconductor layer adjacent to the vertical sidewall of the first gate electrode;
   removing the sidewall spacer after the raised source/drain region is epitaxially grown; and after removing the sidewall spacer, siliciding the vertical sidewall of the first gate electrode and a top surface of the raised source/drain region to form a silicide layer providing a conductive link in direct contact with the vertical sidewall of the first gate electrode and coupling the first gate electrode with the raised source/drain region.

9. The method of claim 8 further comprising:
forming a second gate electrode having a vertical sidewall horizontally spaced from the vertical sidewall of the first gate electrode,
wherein the raised source/drain region is located between the vertical sidewall of the first gate electrode and the vertical sidewall of the second gate electrode, and the silicide layer couples the second gate electrode with the vertical sidewall of the first gate electrode and the raised source/drain region.

10. A method for forming a field-effect transistor, the method comprising:
forming a first gate electrode including a first vertical sidewall and a second vertical sidewall each extending from a top surface of a first semiconductor layer;
forming a first sidewall spacer directly adjacent to the first vertical sidewall of the first gate electrode and a second sidewall spacer directly adjacent to the second vertical sidewall of the first gate electrode;
removing the first sidewall spacer from the first vertical sidewall of the gate electrode;
epitaxially growing a first section of a second semiconductor layer from the top surface of the first semiconductor layer to provide a raised source/drain region adjacent to the first vertical sidewall of the first gate electrode; and
epitaxially growing a second section of the second semiconductor layer from the first vertical sidewall of the first gate electrode that merges with the second section of the second semiconductor layer to form a conductive link in direct contact with the first vertical sidewall of the first gate electrode and coupling the first gate electrode with the raised source/drain region.

11. The method of claim 10 further comprising:
forming a second gate electrode having a vertical sidewall horizontally spaced from the vertical sidewall of the first gate electrode,
wherein the raised source/drain region is located between the vertical sidewall of the first gate electrode and the vertical sidewall of the second gate electrode, and the conductive link includes a third section of the second semiconductor layer that is epitaxially grown from the vertical sidewall of the second gate electrode and merges with the raised source/drain region to couple the second gate electrode with the first gate electrode.

* * * * *

UNITED STATES PATENT AND TRADEMARK OFFICE
CERTIFICATE OF CORRECTION

PATENT NO. : 10,181,522 B2
APPLICATION NO. : 15/437846
DATED : January 15, 2019
INVENTOR(S) : Neogi et al.

Page 1 of 1

It is certified that error appears in the above-identified patent and that said Letters Patent is hereby corrected as shown below:

In the Claims

Column 10, Claim 10, Line 2, after "the", insert --first--

Signed and Sealed this
Twelfth Day of March, 2019

Andrei Iancu
*Director of the United States Patent and Trademark Office*